United States Patent [19]

Childs et al.

[11] 4,409,568

[45] Oct. 11, 1983

[54] TEMPERATURE COMPENSATED TIME DELAY ELEMENT FOR A DIFFERENTIALLY COHERENT DIGITAL RECEIVER

[75] Inventors: William H. Childs, Gaithersburg; Peter A. Carlton, Clarksburg, both of Md.

[73] Assignee: Communications Satellite Corporation, Washington, D.C.

[21] Appl. No.: 223,645

[22] Filed: Jan. 9, 1981

[51] Int. Cl.[3] .......................... H01P 9/00; H03D 3/02

[52] U.S. Cl. .................................... 333/156; 333/161; 333/246; 329/145

[58] Field of Search ............... 333/156, 161, 202, 245, 333/246; 329/145, 50, 110; 375/84–88, 83

[56] References Cited

U.S. PATENT DOCUMENTS

| | | | |
|---|---|---|---|
| 2,928,940 | 3/1960 | Ruthroff | 455/337 X |
| 3,936,751 | 2/1976 | Holmes et al. | 455/214 |
| 3,965,444 | 6/1976 | Willingham et al. | 333/155 |
| 3,983,424 | 9/1976 | Parks | 333/155 |
| 4,054,841 | 10/1977 | Henaff et al. | 329/145 X |
| 4,218,664 | 8/1980 | Assal et al. | 333/156 |
| 4,293,830 | 10/1981 | Accatino | 333/161 |

OTHER PUBLICATIONS

International Microwave Symposium Digest, "Temperature Compensated $BaTi_4O_9$ Microstrip Delay Line", by Lee and Childs, Jun. 1979, pp. 419–421.

*Primary Examiner*—Marvin L. Nussbaum
*Attorney, Agent, or Firm*—Sughrue, Mion, Zinn, Macpeak and Seas

[57] ABSTRACT

A temperature compensated time delay element employs a non-temperature compensated delay element along a first delayed path, and a second non-temperature compensated delay element along a second "undelayed" path to provide a net time delay equal to the difference between the delays in the delayed and undelayed paths. The substrate materials used in the delay elements in the delayed and undelayed paths, and the time delays of the two paths, are selected such that the variation of net phase shift, or time delay, with temperature is zero. The temperature coefficients of the substrate materials in the delayed and undelayed paths can both be positive, thus allowing the use of common substrate materials. The temperature compensated time delay element finds particular utility in differentially coherent signal detection systems.

15 Claims, 5 Drawing Figures

TEMPERATURE COMPENSATED TIME DELAY ELEMENT FOR A DIFFERENTIALLY COHERENT DIGITAL RECEIVER

BACKGROUND OF THE INVENTION

Differentially coherent detection of certain kinds of digitally modulated RF waveforms (e.g., 2, 4, or n level phase shift keying) is a relatively simple method of recovering the digital data. With reference to FIG. 1, a commonly used technique for differential coherent detection of a quartenary phase shift keyed (QPSK) signal is shown. The QPSK signal is applied to a channel filter 10 which provides an output to the differential detector. This filtered signal is applied on the one hand to a first mixer 14 and to a second mixer 16 via delay device 12. The output of the delay device is shifted by $-\pi/2$ radians in phase shifter 18 and applied to the second input of first mixer 14, while the undelayed filtered signal is applied to a second input of second mixer 16. The output of second mixer 16 is applied to a well known decision device 20 which detects the value of the in-phase bits, while the output of mixer 14 is applied to decision means 22 which detects the quadrature bit patterns.

Thus, the technique illustrated in FIG. 1 is performed directly at RF, thereby eliminating the requirement for local oscillators and mixers to thereby realize a particularly simple device.

However, in actually practicing the technique shown in FIG. 1, it has been found that problems occur due to the temperature dependence of the delay device 12. That is, the signalling interval which determines the required delay time is usually of sufficient length that there are many 360 degree phase shifts of the RF waveform stored in the delay element. As a result, the phase shift as a function of temperature will be large, leading to an unacceptable degradation in the detection process.

One such solution for this problem is described in U.S. Patent Application Ser. No. 143,682 to Lee, and in "Temperature Compensated $BaTi_4O_9$ Microstrip Delay Line", by Y. S. Lee and W. H. Childs, 1979 *International Microwave Symposium Digest*, pp. 419–421. Minor refinements of the above referenced techniques are described in "On the Design of Temperature Stabilized Delay Lines", by P. DeSantis, in *IEEE Transactions on Microwave Theory and Techniques*, MTT-28, September 1980, pp 1028–1029.

The above referenced techniques for solving the problems associated with temperature dependent delay elements are illustrated in functional form in FIG. 2. The intent of this approach is to absolutely stabilize the phase variation as a function of temperature across the delay element 24. This is accomplished by using two different substrate materials with opposite signs of temperature coefficients. As an example, one of the materials disclosed as having a negative temperature coefficient is barium tetratitanate ($BaTi_4O_9$) ceramic, and the substrate material having the positive temperature coefficient is saphire. Using microwave integrated circuitry technology, simple transmission lines were constructed using these substrate materials. The line lengths are chosen in such a way that the required time delay and a temperature stable phase characteristic are achieved, as explained in the references.

However, materials with negative temperature coefficients are unusual in nature, and the designer is thus strictly limited in the available choices of negative temperature coefficient materials. In particular, the above mentioned article by Lee and Childs indicates that a 1.5 dB loss per nanosecond of delay is experienced at 24 GHz using the barium tetratitanate ceramic microstrip line. A typical 48 MBs QPSK system would require 42 ns of delay, thereby imparting a 60 dB loss in the delayed path. Although this loss may be somewhat reduced, excessive loss appears to be a major obstacle in applying the abovementioned technique to systems having bit rates in this range.

SUMMARY OF THE INVENTION

The present invention overcomes the problems associated with the above mentioned techniques of providing a temperature independent delay.

In accordance with the present invention, a signal to be differentially demodulated is divided into two paths called the delayed path and the undelayed path. The delayed path (time delay $t_D$) may be a simple transmission line or microwave integrated circuit (MIC) bandpass filter. The undelayed path (time delay $t_U$) is a simple transmission line. The net time delay of the two paths ($t_D$-$t_U$) is the required time delay for signal processing. The substrate materials and the time delays of the two paths are selected such that the variation of net phase shift with temperature is zero.

The temperature coefficients of the substrate materials in accordance with the present invention in the undelayed and delayed paths can have the same sign, and in particular can both be positive, thus allowing the use of common substrate materials. Secondly, it allows the use of low loss MIC bandpass filters, such as those realized on fused silica in the delayed path, thereby reducing the amount of losses for a given net delay to an acceptable level.

DETAILED DESCRIPTION OF THE INVENTION

Figure 1:
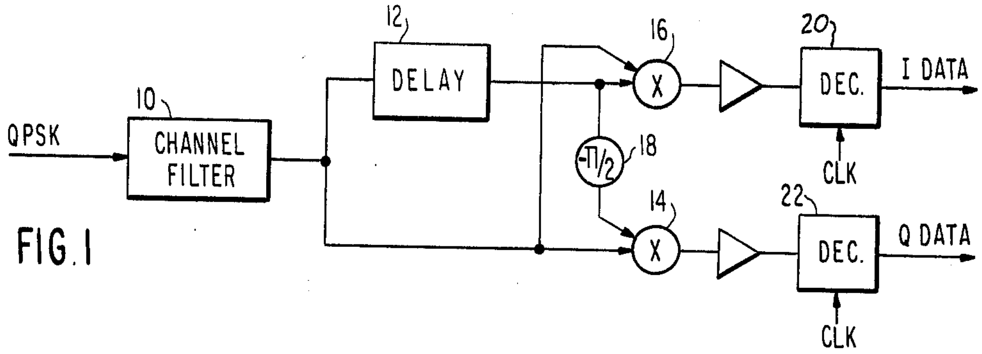
FIG. 1 is a block diagram of a typical differential QPSK receiver.
Figure 2:
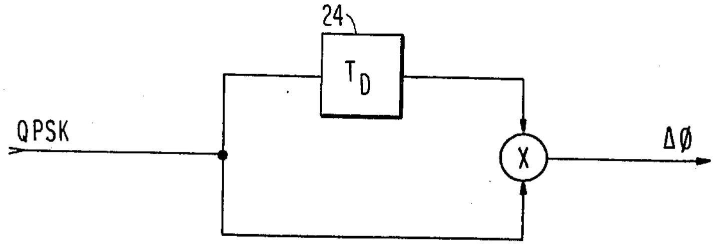
FIG. 2 is a block diagram illustrating the prior art temperature stabilized differential detector having temperature compensation in the delayed path.

In accordance with the present invention, the delay (or phase change) $t_D$ is not temperature stabilized. Rather, an additional delay, $t_U$, is provided in the "undelayed" path, the delay in the delayed path being increased slightly to balance the delay in the "undelayed" path such that the net time delay is at the required value. The substrate materials and the delay times of the delayed and undelayed paths are chosen such that the net time delay or phase shift $$t_R = t_D - t_U \quad (1)$$

is temperature stabilized.

This is accomplished by choosing the time delays and temperature coefficients of the delayed and undelayed paths in accordance with the following analysis.

The fundamental requirement for the present invention, namely that the phase change of the net delay be independent of temperature may be expressed as $$d\phi_D/dT - d\phi_U/dT = 0, \quad (2)$$

where $\phi_D$ and $\phi_U$ are the phase changes across the delayed and undelayed path elements, respectively, and T is temperature. These phase changes can be expressed as $$\phi_D = \omega t_D(V_{GD}/V_{PD}),$$

and $$\phi_U = \omega t_U(V_{GU}/V_{PU}),$$

where $\omega$ is the angular frequency of interest, $V_{GD}$ and $V_{GU}$ are the group velocities at $\omega$ for the delayed and undelayed paths, respectively, and $V_{PD}$ and $V_{PU}$ are the phase velocities at $\omega$ for the delayed and undelayed paths, respectively.

Hence, $$1/\omega = (t_D/\phi_D)(V_{GD}/V_{PD}) = (t_U/\phi_U)(V_{GU}/V_{PU}).$$

By multiplying both sides of equation (2) by $1/\omega$, we arrive at $$(t_D/\omega_D)(V_{GD}/V_{PD})(d\omega_D/dT) - (t_U/\omega_U)(V_{GU}/V_{PU})(d\omega_U/dT) = 0. \quad (3)$$

Recognizing that $(1/\omega_D)(d\omega_D/dT)$ and $(1/\omega_U)(-d\phi_U/dT)$ are equivalent to the temperature coefficients $\alpha_D$ and $\alpha_U$ of the delayed and undelayed paths at D.C., respectively, equation (2) may be rewritten as $$t_D\alpha_D/F_D - t_U\alpha_U/F_U = 0, \quad (4)$$

where $F_D = V_{PD}/V_{GD}$ and $F_U = V_{PU}/V_{GU}$.

By combining equations (1) and (4), we arrive at $$t_D = \frac{t_R}{1 - \frac{(\alpha_D)(F_U)}{(\alpha_U)(F_D)}} \quad (5)$$

and $$t_U = \frac{t_R \frac{(\alpha_D)(F_U)}{(\alpha_U)(F_D)}}{1 - \frac{(\alpha_D)(F_U)}{(\alpha_U)(F_D)}}. \quad (6)$$

The most efficient choice of values for $t_D$ and $t_U$ would be to provide a much higher time delay in the delayed path relative to the undelayed path. Thus, the temperature coefficient of the undelayed path should be chosen to be several (on the order of 10) times greater than the temperature coefficient of the undelayed path. Since the design in accordance with the present invention can be carried out with materials having the same sign of temperature coefficient, the delayed path can be tailored for a minimum loss and the undelayed path may be chosen to implement the required temperature stabilization and net phase shift. Thus, the present invention widens the selection of substrate materials and circuit choices available to the designer, and reduces the loss in the time delay element.

Figure 3:
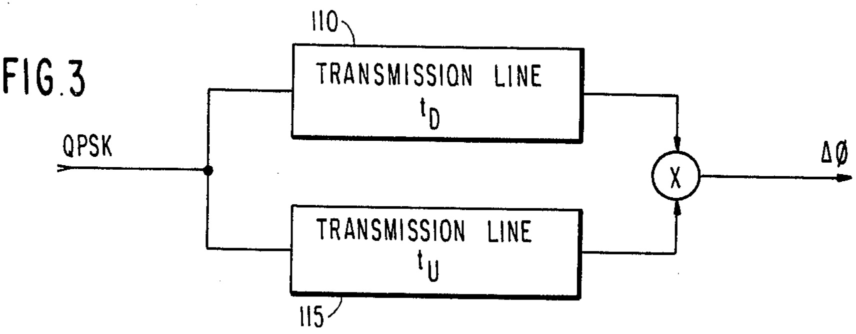
FIG. 3 is a block diagram of a first embodiment of the present invention having temperature compensation in the undelayed path.

Using equations (5) and (6), the delayed and undelayed paths may be realized as simple transmission lines 110 and 115 as shown in FIG. 3. The physical length of the transmission lines is prescribed by the time delays $t_D$ and $t_U$ as determined from equations (5) and (6), and their respective group velocities at the frequency of interest, in accordance with $$l = V_G \cdot t, \quad (7)$$

where $l$ is the length of the transmission line, $V_G$ is the group velocity $V_{GU}$ or $V_{GD}$, and t is equal to the determined time delay $t_D$ or $t_U$.

Figure 4:
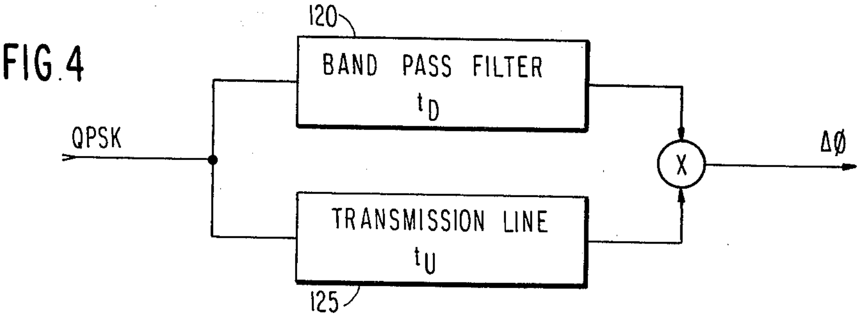
FIG. 4 is a block diagram of a second and preferred embodiment of the present invention having temperature compensation in the undelayed path.

FIG. 4 is an illustration of the preferred embodiment of the present invention, where bandpass filter 120 is used to provide the delay in the delayed path. Since the temperature coefficient of the bandpass filter 120 must be determined empirically, equations (5) and (6) can be rewritten as $$t_D = \frac{t_R}{1 - \frac{(\alpha'_D)}{(\alpha_U)} F_U} \quad (8)$$

and $$t_U = \frac{t_R \frac{(\alpha'_D)}{(\alpha_U)} F_U}{1 - \frac{(\alpha'_D)}{(\alpha_U)} F_U}, \quad (9)$$

where $\alpha'_D$ (at $\omega$) $= \alpha_D$ (at D.C.)$/F_D$. Similarly, if the temperature coefficient of the transmission (undelayed) line is measured rather than calculated, a similar substitution of $\alpha'_U$ for $\alpha_U/F_U$ can be made in equations (8) and (9). The length of transmission line 125 for the undelayed path in the FIG. 4 embodiment is chosen in accordance with equation (7). Thus, given the required net time delay, $t_R$, two materials having temperature coefficients $\alpha_D$ and $\alpha_U$ may be chosen to provide any particular delayed and undelayed phase shift in accordance with equations (5) and (6) or (8) and (9).

While the transmission lines 110, 115 and 125 may be implemented by simply providing an appropriate line length, bandpass filter 120 may be designed in accordance with well known MIC design techniques, as described, for example, in "Design Techniques for Bandpass Filters Using Edge-Coupled Microstrip Lines on Fused Silica", by Dr. William H. Childs, 1976, *IEEE International Microwave Symposium Digest*, pp. 194–196.

Figure 5:
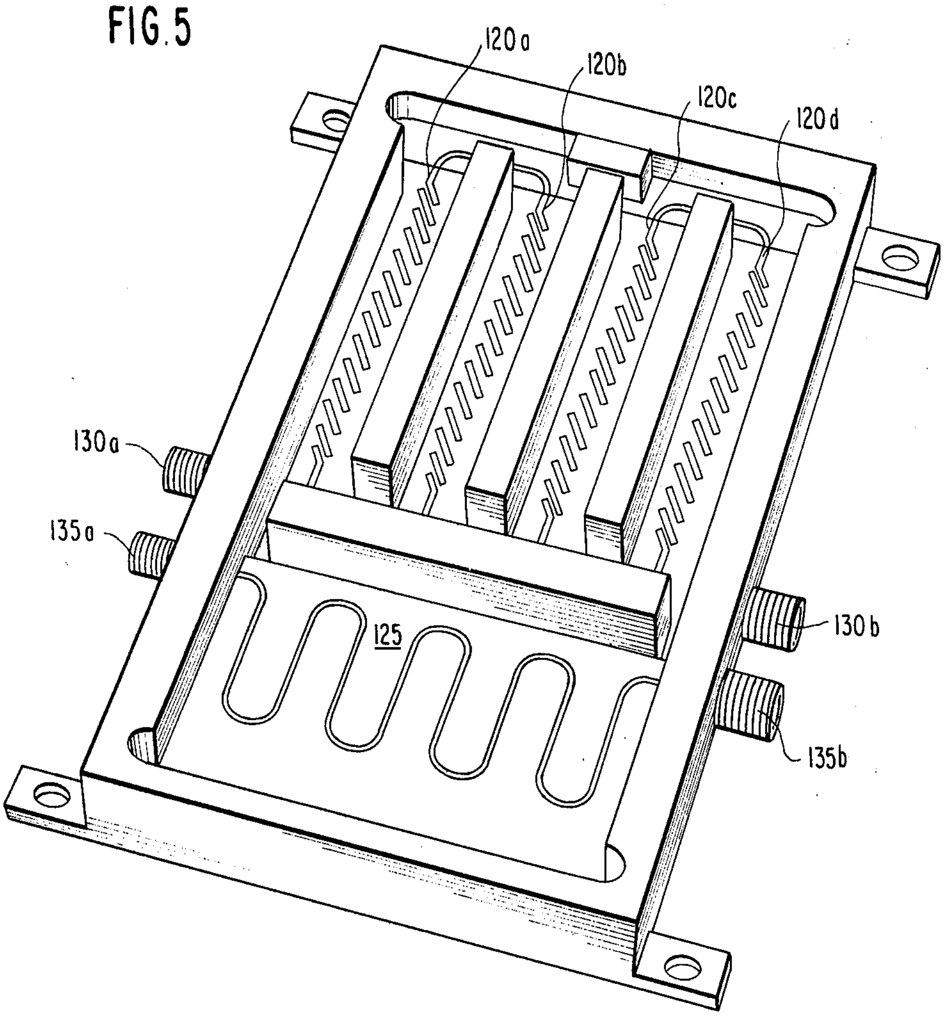
FIG. 5 is an illustration of an implementation of the delay element constructed in accordance with the present invention.

FIG. 5 is an illustration of a time delay element implemented in accordance with the present invention. A 120 MBs 14 GHz QPSK system has a 16.7 ns symbol period. Therefore, $t_R = 16.7$ ns. The delayed path 120 is implemented using 4 MIC bandpass filters on 0.015 inch thick fused silica (amorphous $SiO_2$) substrates. Measurements have shown that $$\alpha'_D(\text{at } 14\ \text{GHz}) = (1/\phi_D)d\phi_D/dT = 6.5 \times 10^{-6}.$$

The undelayed path is a simple microstrip transmission line on 0.025 inch thick alumina substrate. The temperature coefficient of phase for alumina is known to be approximately $$\alpha_U = \frac{1}{\phi_U} \frac{d\phi_U}{dT} = 75 \times 10^{-6}$$

The dispersion relation for the above microstrip transmission line at 14 GHz is known to be $$F_U = V_{PU}/V_{GU} = 1.065.$$

Solution of equations (8) and (9) provides $$t_D = 1.102t_R = 18.4 \text{ ns},$$

and $$t_U = 0.102t_R = 1.7 \text{ ns}.$$

The filters in the delayed path are designed using the well known techniques described in the above cited article, while the length of the microstrip transmission line as found from equation (7) is 7.03 inches.

As shown in FIG. 5, the bandpass filter 120 of FIG. 4 is implemented with 4 interconnected MIC bandpass filters 120*a*–120*d*, each filter having approximately 4.55 ns delay at 14.250 GHz. The input/output ports 130*a* and 130*b* are shown. The filter interconnections provide an additional 0.5 ns. The 7.03 inch transmission line is implemented on a 2.0×1.5×0.025 inch alumina (99.5 percent) substrate and is also provided with ports 135*a* and 135*b*. The net time delay of the unit is 16.7 ns. Similar units have been temperature cycled over a 40° C. range with not more than 1.0 electrical degree change in net phase shift. Similar units having bandpass filter portions realized on 0.025 inch thick fused silica substrates for decreased loss have exhibited a loss of less than 16 dB at approximately 14 GHz.

Thus, by selecting from the many common substrates having positive temperature coefficients, the required characteristics for the delayed and undelayed paths of the present invention may be determined in accordance with equations (5) and (6), or (8) and (9), in order to produce the desired net time delay substantially independent of temperature. Further, the circuits in accordance with the present invention may be implemented using well known MIC techniques to thereby provide a low loss, compact structure.

The device in accordance with the present invention is primarily intended for signal processing applications and, more particularly, for applications involving the differentially coherent detection of RF waveforms with digital modulation at microwave frequencies. However, it should be clear to those skilled in the art that the circuits in accordance with the present invention find many applications other than differentially coherent detection at microwave frequencies, and the present invention is not intended to be limited thereto.

What is claimed is:

1. A signal delay circuit having first and second parallel paths providing signal delays $t_D$ and $t_U$ respectively, said circuit having a preselected net delay $t_R$, means in said second path for producing variations in delay with temperature to offset the changes in delay with temperature of the first path, the first path having a temperature coefficient $\alpha_D$ and the second path having temperature coefficient $\alpha_U$ of the same sign as $\alpha_D$, wherein $t_R = t_D - t_U$.

2. The circuit of claim 1 wherein $\alpha_D$ and $\alpha_U$ are positive.

3. The circuit of claim 1 or 2 wherein
$t_D$ is approximately equal to $t_R/(1-\alpha_D/\alpha_U)$, and
$t_U$ is approximately equal to $t_R(\alpha_D/\alpha_U)/(1-\alpha_D/\alpha_U)$.

4. The circuit of claims 1, 2 or 3 wherein said first delay means comprises a bandpass filter.

5. The circuit of claim 4 wherein said second delay means comprises a transmission line.

6. The circuit of claims 1, 2 or 3 wherein said first and second delay means comprise first and second transmission lines, respectively.

7. The circuit of claims 1, 2 or 3 wherein said second temperature coefficient is substantially greater than said first temperature coefficient.

8. A circuit for demodulating signals comprising:
first delay means provided for delaying said signals by time $t_D$; second delay means provided for delaying said signals by time $t_U$; and means for mixing outputs of said first and second delay means, wherein said first delay means has a first temperature coefficient $\alpha_D$, said second delay means has a second temperature coefficient $\alpha_U$, said delay times $t_D$ and $t_U$ being chosen relative to said first and second temperature coefficients such that the net delay $t_R = t_D - t_U$ is substantially independent of temperature.

9. The circuit of claim 8 wherein
$t_D$ is approximately equal to $t_R/(1-\alpha_D/\alpha_U)$, and
$t_U$ is approximately equal to $t_R(\alpha_D/\alpha_U)/(1-\alpha_D/\alpha_U)$.

10. The circuit of claims 8 or 9 wherein said first delay means comprises a bandpass filter.

11. The circuit of claim 10 wherein said second delay means comprises a transmission line.

12. The circuit of claims 8 or 9 wherein said first and second delay means comprise first and second transmission lines, respectively.

13. The circuit of claims 8 or 9 wherein said second temperature coefficient is substantially greater than said first temperature coefficient.

14. A method of demodulating signals comprising:
delaying said signals by time $t_D$ along a first delay path;
delaying said signals by time $t_U$ along a second delay path;
mixing the first and second delayed signals;
providing a first temperature coefficient $\alpha_D$ for said first path;
providing a first temperature coefficient $\alpha_U$ for said second path; and
choosing said delay times $t_D$ and $t_U$ relative to said first and second temperture coefficients such that the net delay $t_R = t_D - t_U$ is substantially independent of temperature.

15. The method of claim 14 further comprising:
choosing $t_D$ to be approximately equal to $t_R/(1-\alpha_D/\alpha_U)$; and
choosing $t_U$ to be approximately equal to $t_R(\alpha_D/a_U)/(1-a_D/a_U)$.

* * * * *